United States Patent
Allinger et al.

(10) Patent No.: US 9,564,403 B2
(45) Date of Patent: Feb. 7, 2017

(54) MAGNETIC SHIELDING OF PERPENDICULAR STT-MRAM

(71) Applicant: Infineon Technologies AG, Neubiberg (DE)

(72) Inventors: Robert Allinger, Unterhaching (DE); Karl Hofmann, Munich (DE); Klaus Knobloch, Dresden (DE); Robert Strenz, Radebeul (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/038,959

(22) Filed: Sep. 27, 2013

(65) Prior Publication Data

US 2015/0091109 A1    Apr. 2, 2015

(51) Int. Cl.
| | | |
|---|---|---|
| *H01L 27/22* | (2006.01) | |
| *H01L 23/552* | (2006.01) | |
| *H01L 43/12* | (2006.01) | |
| *H01L 43/02* | (2006.01) | |
| *H01L 43/08* | (2006.01) | |

(52) U.S. Cl.
CPC .......... *H01L 23/552* (2013.01); *H01L 27/222* (2013.01); *H01L 27/228* (2013.01); *H01L 43/02* (2013.01); *H01L 43/08* (2013.01); *H01L 43/12* (2013.01); *H01L 2924/0002* (2013.01)

(58) Field of Classification Search
CPC ...... H01L 23/552; H01L 27/22; H01L 27/222; H01L 43/12
USPC .................................................. 257/421, 422
See application file for complete search history.

(56) References Cited

U.S. PATENT DOCUMENTS

| | | | |
|---|---|---|---|
| 6,740,948 B2 | 5/2004 | Sharma et al. | |
| 2007/0241410 A1 | 10/2007 | Umehara et al. | |
| 2010/0072566 A1* | 3/2010 | Kang et al. | 257/422 |
| 2012/0068281 A1 | 3/2012 | Saida et al. | |
| 2012/0205764 A1* | 8/2012 | Chen et al. | 257/422 |
| 2013/0069184 A1 | 3/2013 | Aikawa et al. | |
| 2013/0249024 A1 | 9/2013 | Saida et al. | |

FOREIGN PATENT DOCUMENTS

| | | |
|---|---|---|
| CN | 102169728 A | 8/2011 |
| CN | 103107281 A | 5/2013 |
| JP | 2007-273493 A | 10/2007 |
| JP | 2010-016148 A | 1/2010 |
| JP | 2010067643 A | 3/2010 |
| KR | 2011-0074559 A | 6/2011 |
| WO | WO-2012/112619 A1 | 8/2012 |

OTHER PUBLICATIONS

Office Action dated Dec. 18, 2014 for German Patent Application No. 102014013910.7.
Notice of Preliminary Rejection dated Oct. 19, 2015 for Korean Patent Application No. 10-2014-0128538.
Office Action dated Sep. 28, 2016 for Chinese Patent Application No. 201410500816.0.

* cited by examiner

*Primary Examiner* — Selim Ahmed
(74) *Attorney, Agent, or Firm* — Schiff Hardin LLP

(57) ABSTRACT

A memory having an array of perpendicular spin-transfer torque (STT) magnetic random access memory (MRAM) cells, wherein each cell has a magnetic layer stack. A magnetic shield disposed between the cells and having a minimum height of at least the height of the magnetic layer stacks.

20 Claims, 11 Drawing Sheets

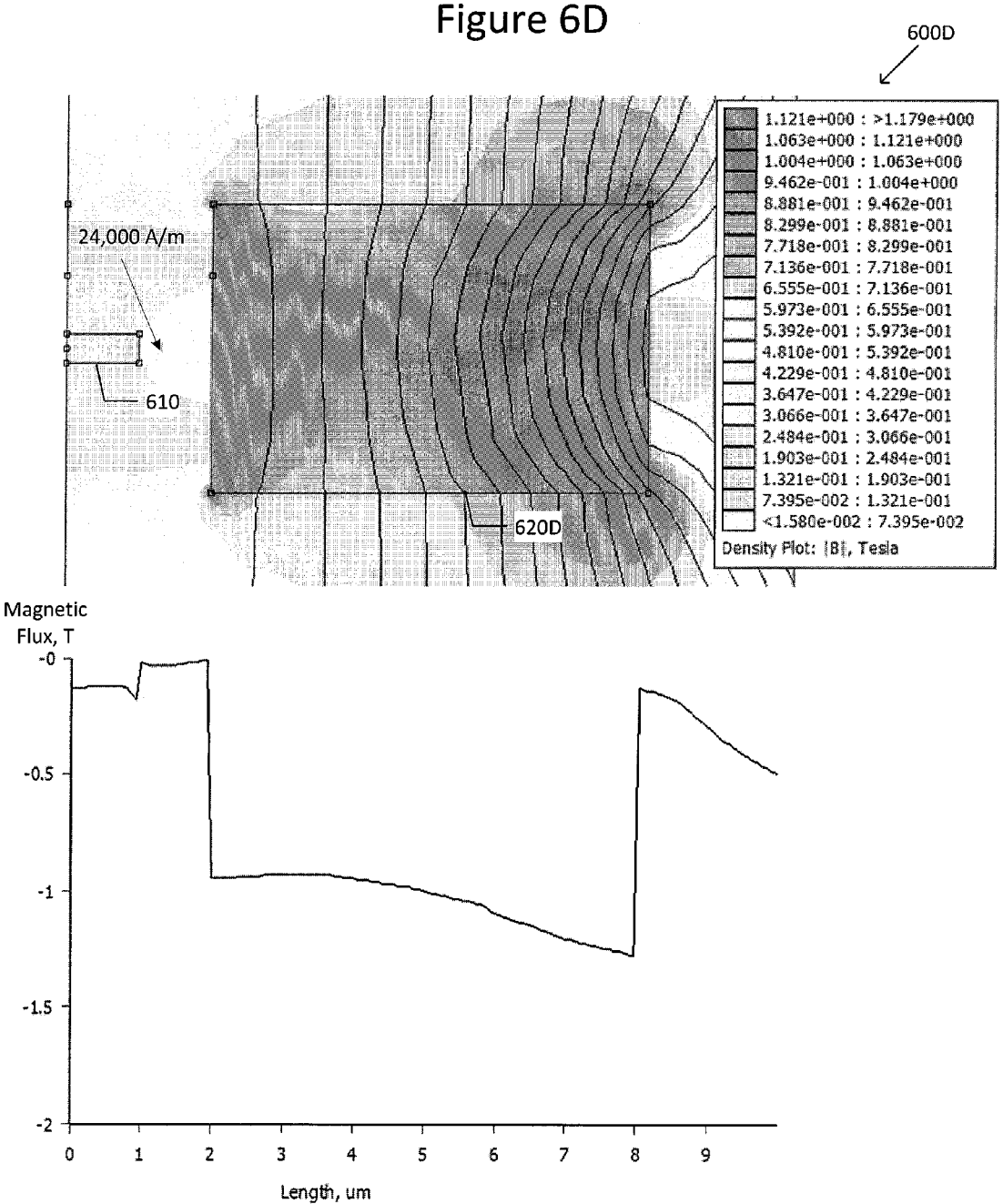

MAGNETIC SHIELDING OF PERPENDICULAR STT-MRAM

BACKGROUND

Perpendicular Spin-Transfer Torque (STT) Magnetic Random Access Memory (MRAM) is an embedded non-volatile memory technology based on magnetoresistance.

FIG. 1 illustrates a schematic diagram 100 of a perpendicular STT-MRAM stack 110 coupled to a transistor 120. Unlike typical RAM technologies, which store data as electric charge, MRAM data is stored by magnetoresistive elements. Generally, the magnetoresistive elements are made from two magnetic layers, each of which holds a magnetization. The magnetization of one layer (the "fixed layer" or "pinned layer" 110A) is fixed in its magnetic orientation, and the magnetization of the other layer (the "free layer" 110C) can be changed by a spin polarized programming current. Thus, the programming current can cause the magnetic orientations of the two magnetic layers to be either in a same direction, providing a lower electrical resistance across the layers ("0" state), or in opposing directions, providing a higher electrical resistance across the layers ("1" state). The switching of the magnetic orientation of the free layer 110C and the resulting high or low resistance states across the magnetic layers provide for the write and read operations of the typical MRAM cell.

The magnetic layer stack 110 in combination with top and bottom electrodes (not shown) located on top of the free layer and below the fixed layer, respectively, is known as a magnetic tunnel junction (MTJ). A programming current typically flows through the access transistor 120 and the MTJ. The fixed layer polarizes the electron spin of the programming current, and torque is created as the spin-polarized current passes through the MTJ. The spin-polarized electron current interacts with the free layer by exerting a torque on the free layer. When the torque of the spin-polarized electron current passing through the MTJ is greater than the critical switching current density, the torque exerted by the spin-polarized electron current is sufficient to switch the magnetization of the free layer. Thus, the magnetization of the free layer can be aligned to be either in a same or an opposing direction to the pinned layer, and the resistance state across the MTJ is changed.

FIG. 2 illustrates a schematic diagram of an STT-MRAM cell 200, which may be fabricated to form an array of memory cells in a grid pattern including a number of rows and columns, or in various other arrangements depending on the system requirements and fabrication technology. STT-MRAM cell 200 includes magnetic layer stack 210, bottom electrode 290, top electrode 295, bit line 220, source line 230, access transistor 240, word line 250, read/write circuitry 260, sense amplifier 270, and bit line reference 280.

A programming current is applied for the write operation of STT-MRAM cell 200. To initiate the programming current, read/write circuitry 260 may generate a write current to bit line 220 and source line 230. The polarity of the voltage between bit line 220 and source line 230 determines the switch in magnetization of the free layer in the magnetic layer stack 210. Once the free layer 210C is magnetized according to the spin polarity of the programming current, the programmed state is written to the STT-MRAM cell 200.

To read STT-MRAM cell 200, read/write circuitry 260 generates a read current to bit line 220 and source line 230 through magnetic layer stack 210 and transistor 240. The programmed state of STT-MRAM cell 200 depends on the resistance across magnetic layer stack 210 which may be determined by the voltage difference between bit line 220 and source line 230. In some embodiments, the voltage difference may be compared to a reference 280 and amplified by sense amplifier 270.

Vertical external magnetic fields can affect the magnetic moment of the free layer resulting in undesired bit flipping. It takes a vertical magnetic field of only a few hundred Oersted (Oe) to disturb stored information. Many applications of perpendicular STT-MRAMs require a higher magnetic robustness.

In-plane STT-MRAMs, as opposed to perpendicular STT-MRAMs, are susceptible to external magnetic fields that are horizontal. This is because in-plane STT-MRAMs are written by a programming current that causes the magnetic orientations of two magnetic layers to be either horizontally in parallel or antiparallel. Stability of in-plane MRAMs with respect to external magnetic fields can be increased using magnetic shields located on the top and bottom of the dies. However, this magnetic shielding concept is only applicable to in-plane STT-MRAMs, not perpendicular STT-MRAMs. For perpendicular STT-MRAM applications, it is the vertical magnetic fields that are of concern. Therefore, applications of perpendicular STT-MRAMs require effective shielding of vertical external magnetic fields.

BRIEF DESCRIPTION OF THE DRAWINGS

FIGS. 6A-6E illustrate magnetic flux density plots of a perpendicular STT-MRAM cell in a homogenous magnetic field in accordance with exemplary embodiments.

DETAILED DESCRIPTION

The present disclosure is directed to a memory having an array of perpendicular spin-transfer torque (STT) magnetic random access memory (MRAM) cells, wherein each cell has a magnetic layer stack. A magnetic shield disposed between the cells and having a minimum height of at least the height of the magnetic layer stacks.

Figure 3:
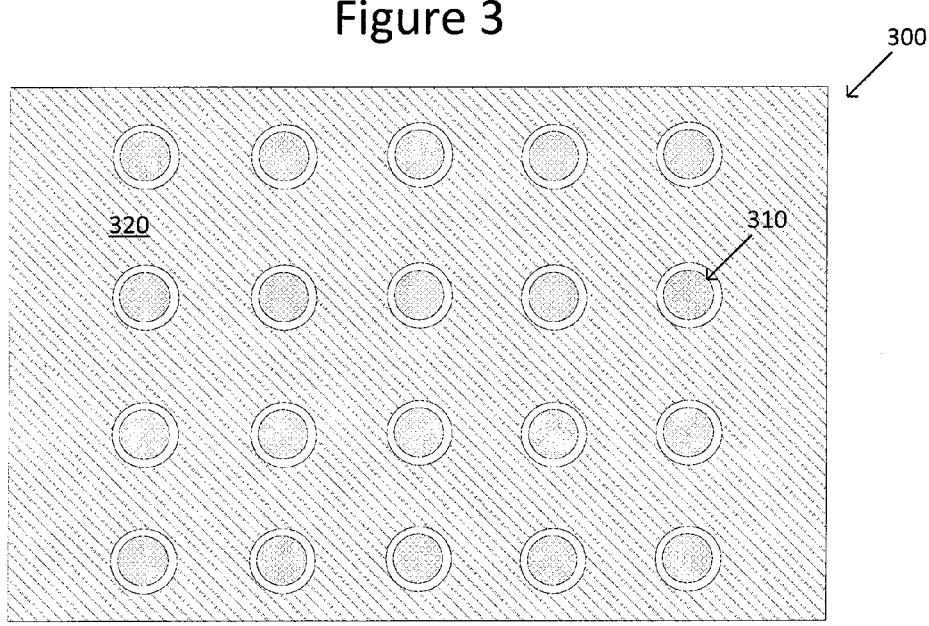
FIG. 3 illustrates a top-view diagram of an array of perpendicular STT-MRAM cells in accordance with an exemplary embodiment.

FIG. 3 illustrates a top-view diagram of an array 300 of perpendicular STT-MRAM cells in accordance with an exemplary embodiment. A magnetic shield 320 to protect each cell having dipole 310 against vertical external magnetic fields is located between the cells 310.

Figure 1:
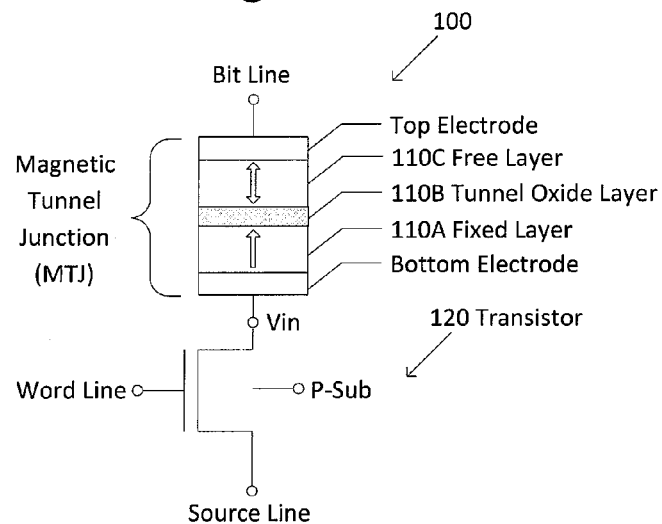
FIG. 1 illustrates a schematic diagram of a perpendicular STT-MRAM stack coupled to a transistor.
Figure 2:
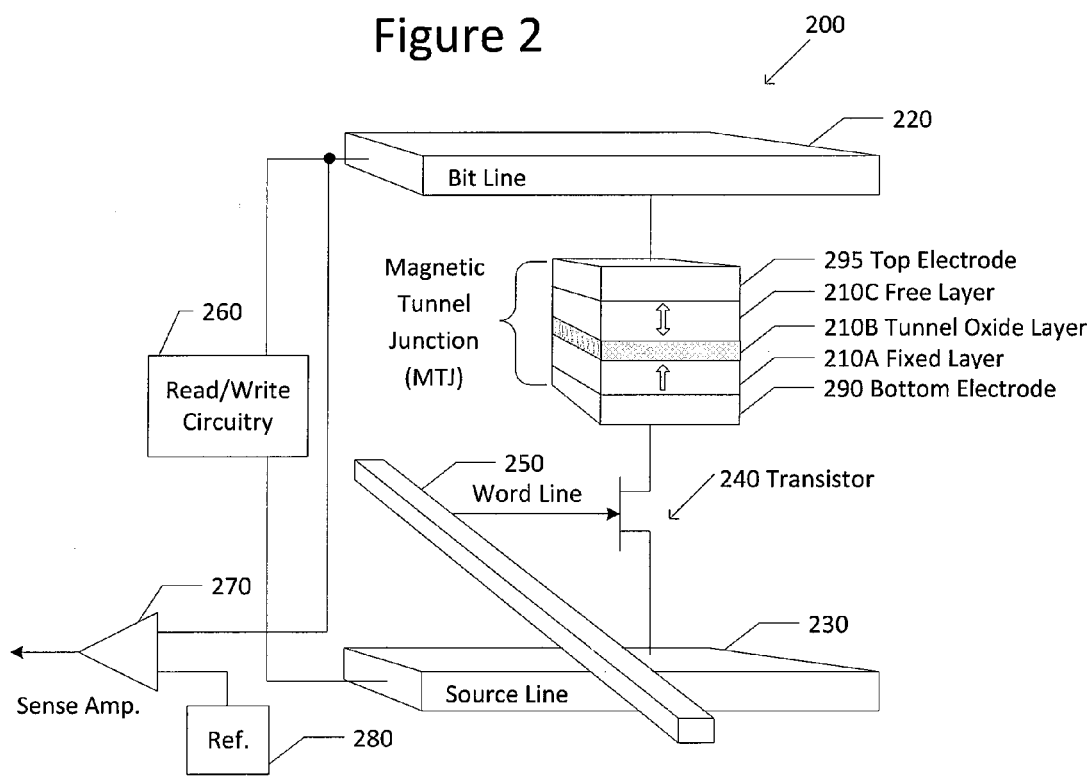
FIG. 2 illustrates a schematic diagram of a memory cell.
Figure 4A:
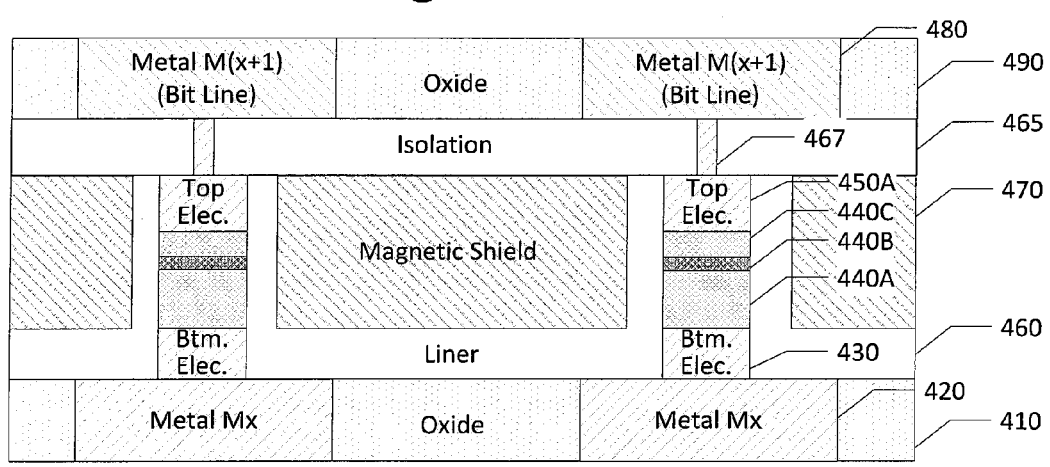
FIGS. 4A-4B illustrate a side-view diagrams of arrays of perpendicular STT-MRAM cells in accordance with exemplary embodiments.

FIG. 4A illustrates a side-view diagram of an array 400A of perpendicular STT-MRAM cells in accordance with an exemplary embodiment. STT-MRAM array 400A includes Metal Mx 420 formed in oxide 410. Metal Mx 420 is the metal wire between magnetic layer stack 210 and transistor 240 shown in FIG. 2. Bottom electrodes 430 are deposited on metal Mx 420. Magnetic layer stack 440, which is comprised of fixed magnetic layer 440A and free magnetic layer 440C with tunnel oxide layer 440B therebetween, are deposited on bottom electrode 430. For the sake of simplicity, the figure shows each magnetic layer stack 440 having stack layers 440A, 440C and tunnel oxide layer 440B, but as is known, in reality there are additional layers. Top electrode 450A is formed on magnetic layer stack 440. Dielectric liner 460, which has a thickness large enough to provide electrical isolation from magnetic shield 470, is deposited thereon. Magnetic shield 470A is preferably placed as close as possible to magnetic layer stack 440 to increase its efficiency in protecting the STT-MRAM cells against vertical magnetic fields. Also, magnetic shield 470A is preferably located in at least one of horizontal and vertical symmetrical arrangement with respect to the free magnetic layers 440C within magnetic layer stacks 440. An isolation layer 465 is deposited on magnetic shield 470A. Finally, metal M(x+1) layer 480 deposited in oxide 90 is located on top of isolation layer 465. Metal M(x+1) layer 480 is bit line 220 shown in FIG. 2. Top electrode 450A ensures electrical contact between magnetic stack layer 440C and metal M(x+1) layer 480 through via 467. As should be appreciated by those of ordinary skill, the elements of array 400A are not necessarily drawn to scale.

Figure 4B:
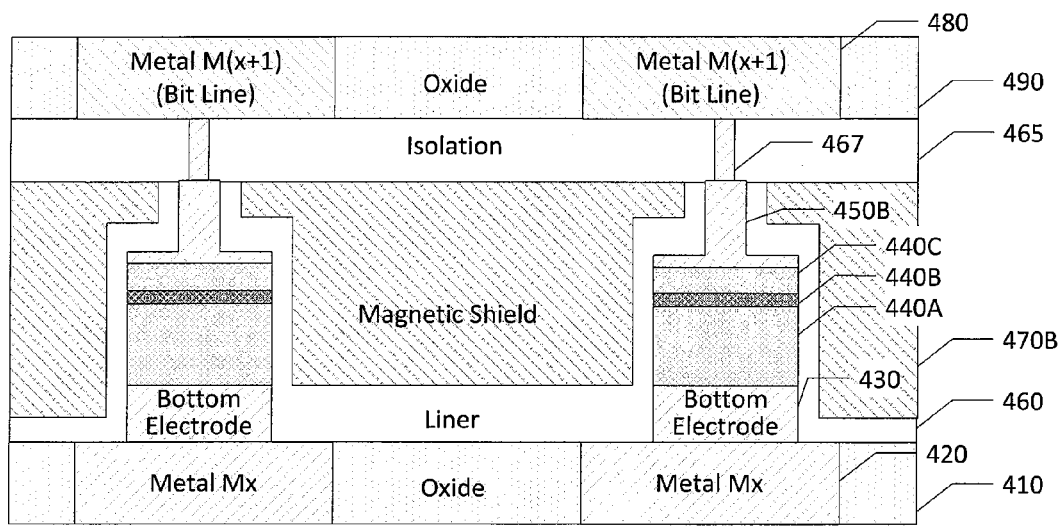

FIG. 4B illustrates a side-view diagram of an array 400B of perpendicular STT-MRAM cells in accordance with another exemplary embodiment. STT-MRAM array 400B is similar to array 400A of FIG. 4A, except that top electrodes 450 and magnetic shields 470 are shaped differently. More specifically, magnetic shield 470B is not shaped as a rectangle as shown in FIG. 4A, but is instead shaped to have a horizontal projection formed at each of its top edges. Top electrode 450B is shaped to have a diameter of its upper portion be less than the diameter of magnetic layer stack 440 so as to accommodate the horizontal projection, or "nose", of magnetic shield 470B. Of course there is still electrical isolation between electrode 450B and magnetic shield 470B using liner 460. Other elements of FIG. 4B are similar to those of FIG. 4A, and thus their descriptions are omitted here for the sake of brevity. As with array 400A, the elements of array 400B are not necessarily drawn to scale.

Figure 5:
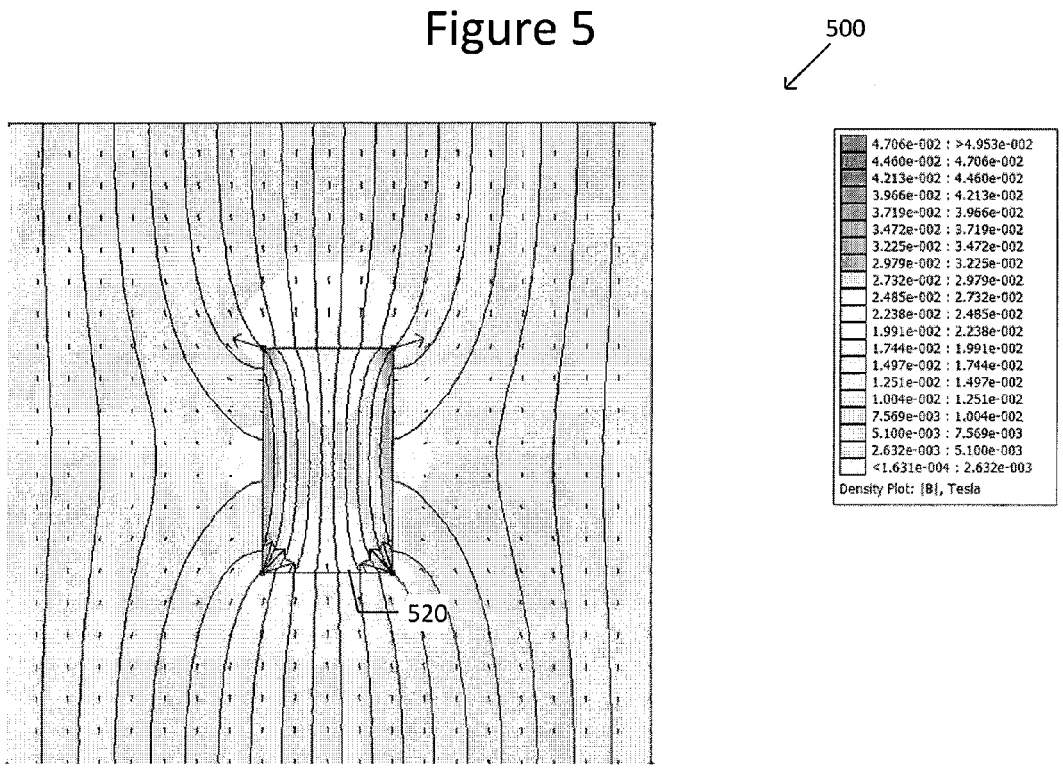
FIG. 5 illustrates magnetic shield material in a homogeneous magnetic field.

FIG. 5 illustrates magnetic shield material in a homogeneous magnetic field. As can be seen, the magnetic shield material 520 collects (reduces, sinks) external magnetic fields. In general, the material has certain properties such as high permeability, little or no magnetic coercivity, and large saturation magnetization.

A high permeability, typically at least 10,000, is preferable, though between 50,000 and 140,000 is practical. Permeablility is a measure of the ability of the shield to support the formation of a magnetic field within itself. By having a high permeability, the magnetic shield collects vertical magnetic field lines, thus lowering the magnetic field in its surroundings.

The magnetic shield material also preferably has little or no magnetic remanence. Remanence is the magnetization left behind in the material after an external magnetic field is removed.

A large saturation magnetization, typically in the range of 500 mT to 1.5 T (Tesla), is preferable. Saturation is a state reached when an increase in an applied external magnetic field cannot increase the magnetization of the material further, so the total magnetic flux density levels off.

The material of the magnetic shield might include one or more layers of ferromagnets. This includes alloys of nickel (Ni), iron (Fe), and cobalt (Co) (e.g., nickel iron (NiFe), nickel iron cobalt (NiFeCo), cobalt iron (CoFe)), other relatively high permeability alloys of NiFe and Co, etc. of various combinations, doped amorphous ferromagnetic alloys, and other materials. The material may contain additives of molybdenum and chromium, for example, Mu-metal (Ni+Fe), which is a range of nickel-iron alloys composed of approximately 77% nickel, 16% iron, 5% copper and 2% chromium or molybdenum. Also, materials characterized as ferrimagnets or ferrites may be used. Those skilled in the art should appreciate that the magnetic shield may be comprised of any material suitable for the intended purpose of collecting external magnetic fields.

FIGS. 6A-6E illustrate magnetic flux density plots of a perpendicular STT-MRAM magnetic layer stack 610 in a homogenous magnetic field in accordance with exemplary embodiments.

Figure 6A:
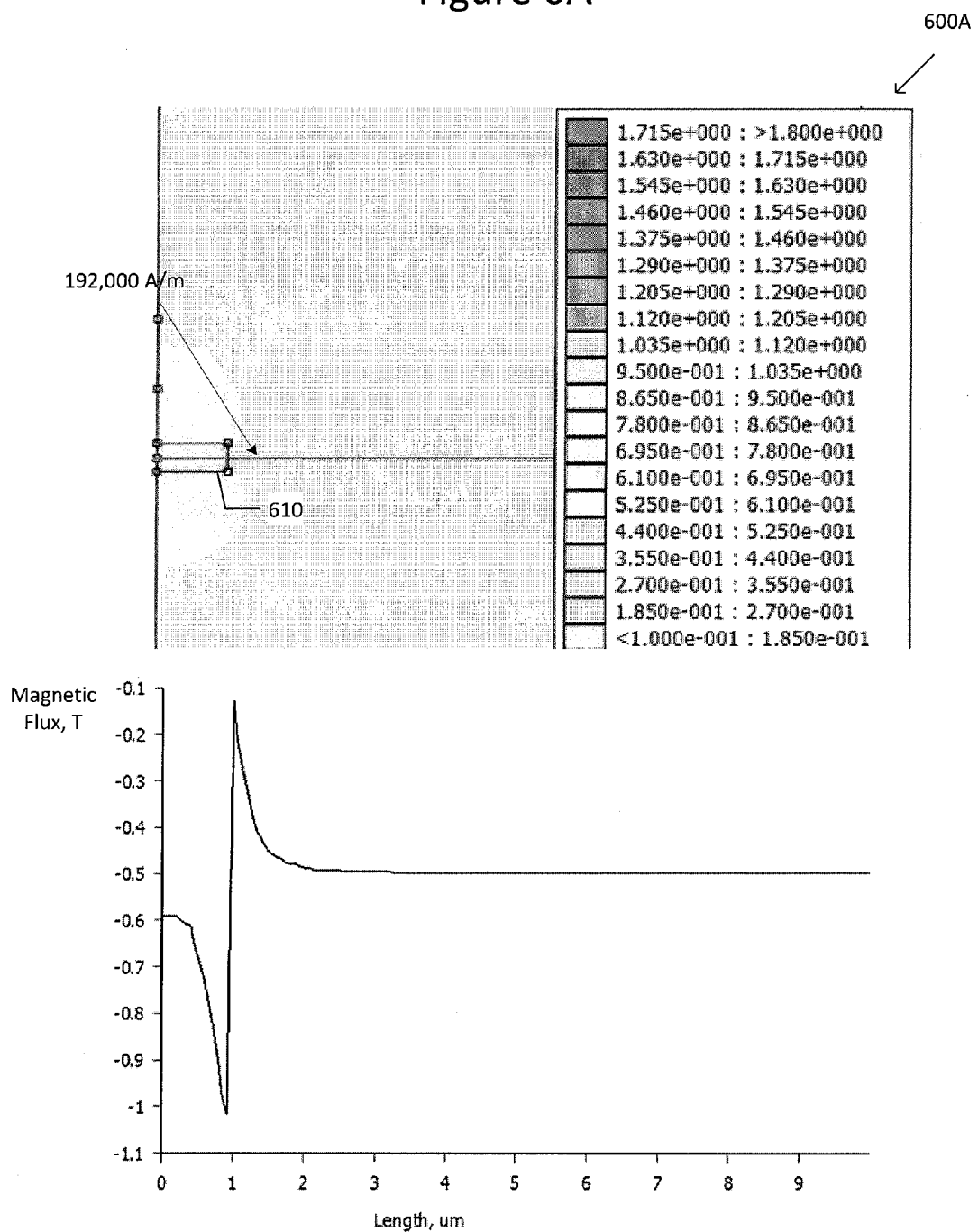

FIG. 6A illustrates a magnetic flux density plot 600A of a perpendicular STT-MRAM magnetic layer stack 610 in a homogenous magnetic field having a magnetic flux density of 0.5 tesla (T), which is equivalent to 400,000 amperes per meter (A/m). No magnetic shield is included in this figure so that it can be used as a baseline comparison for the figures to follow. As can be seen from the density plot 600A in the top portion of the figure, the magnetic flux density in the vicinity of STT-MRAM cell is 192,000 A/m. The bottom portion of the figure illustrates a graph of the same magnetic flux. As shown, magnetic layer stack 610 concentrates the magnetic flux inside to be a higher value (−0.6 T) than the external applied magnetic field (−0.5 T). Further outside of the magnetic layer stack the magnetic flux levels out at −0.5 T.

Figure 6B:
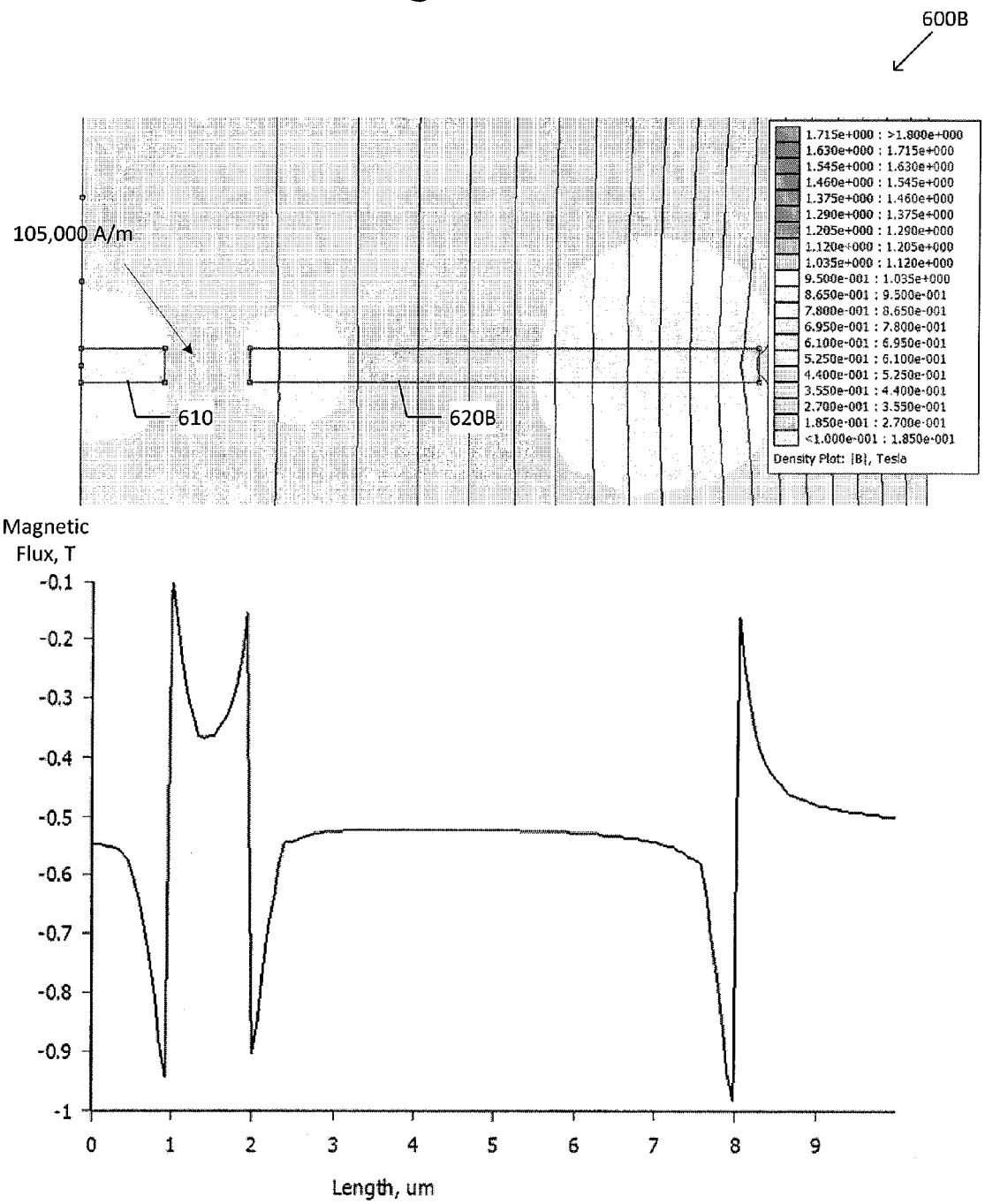

FIG. 6B illustrates magnetic flux density plot 600B of a perpendicular STT-MRAM magnetic layer stack 610 with a horizontal magnetic shield 620B in its vicinity in accordance with an exemplary embodiment. The homogenous magnetic field provided is the same as that in FIG. 6A. To realize an efficient magnetic shielding of the STT-MRAM magnetic layer stack 610, it is preferable that the magnetic shield 620B be placed in close proximity to the STT-MRAM magnetic layer stack 610 in order to collect as much of the external magnetic fields in the vicinity of the STT-MRAM magnetic layer stack 610 as possible. As can be seen from density plot 600B in the upper portion of the figure, the magnetic flux density in the space between STT-MRAM magnetic layer stack 610 and magnetic shield 620B decreases to 105,000 A/m. The graph in the lower portion of the figure shows the magnetic flux density in the magnetic shield 620B increased to −0.6 T, whereas the magnetic flux density in the space between STT-MRAM magnetic layer stack 610 and magnetic shield 620B is decreased to −0.4 T. Also, the magnetic flux density in the left-most region of the graph is significantly smaller than the respective magnetic flux in FIG. 6A. This is because magnetic shield 620B sinks magnetic flux density, thereby decreasing magnetic flux density in the surrounding region.

Figure 6C:
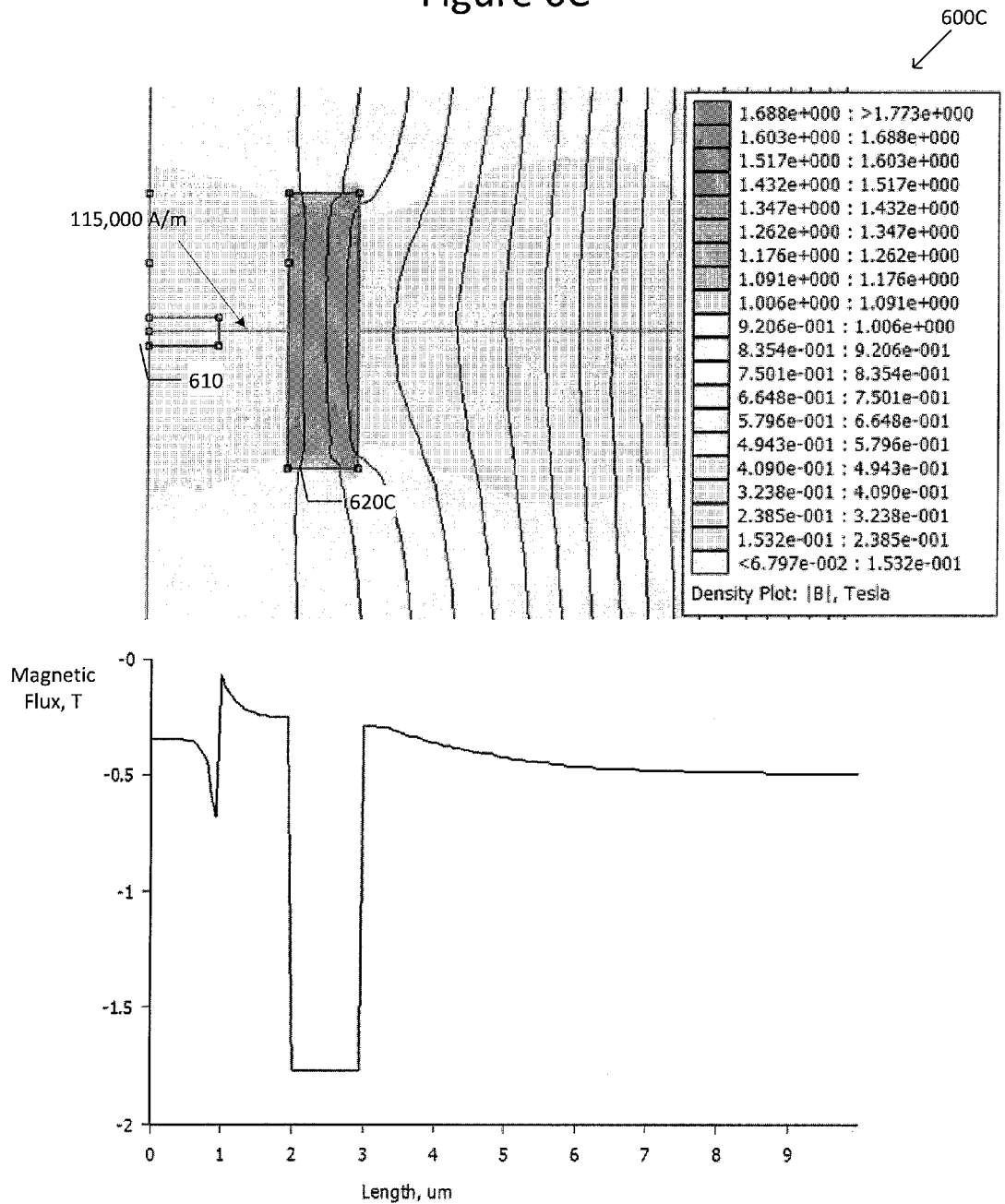

FIG. 6C illustrates magnetic flux density plot 600C of a perpendicular STT-MRAM magnetic layer stack 610 with magnetic shield 620B having a larger height, as compared with that of FIG. 6B, in accordance with an exemplary embodiment. The homogenous magnetic field provided is the same as that in FIG. 6A. To realize an efficient magnetic shielding of the STT-MRAM magnetic layer stack 610, it is preferable that the magnetic shield height be higher than the magnetic layer stack 430 of STT-MRAM magnetic layer stack 610 to be protected. In one exemplary embodiment, magnetic shield 620C is a maximum possible height between metal wiring lines located below and above the magnetic cell stack.

As can be seen from density plot 600C in the upper portion of the figure, the magnetic flux density in the space between STT-MRAM magnetic layer stack 610 and magnetic shield 620C decreases to 115,000 A/m. The graph in the lower portion of the figure shows the magnetic flux density in the magnetic shield 620C increased to −1.75 T, whereas the magnetic flux density in the space between STT-MRAM magnetic layer stack 610 and magnetic shield 620C is decreased to only −0.25 T. Also, the magnetic flux density in the left-most region of the graph is significantly smaller than the respective magnetic flux in FIG. 6B. As mentioned above, this is because magnetic shield 620C sinks magnetic flux density, thereby decreasing magnetic flux density in the surrounding region.

FIG. 6D illustrates magnetic flux density plot 600D of a perpendicular STT-MRAM magnetic layer stack 610 with magnetic shield 620C having a larger horizontal shield width, as compared with those of FIGS. 6B and 6C, in accordance with an exemplary embodiment. The homogenous magnetic field provided is the same as that in FIG. 6A. To realize an efficient magnetic shielding of the STT-MRAM magnetic layer stack 610, it is preferable that the shield's horizontal width be large enough to fill space not occupied by bordering magnetic layer stacks. In one exemplary embodiment, magnetic shield 620D fills as much of the space between STT-MRAM cells as possible.

As can be seen from density plot 600D in the upper portion of the figure, the magnetic flux density in the space between STT-MRAM magnetic layer stack 610 and magnetic shield 620D decreases to only 24,000 A/m. The graph in the lower portion of the figure shows the magnetic flux density in the magnetic shield 620D increased to −1.0 T, whereas the magnetic flux density in the space between STT-MRAM magnetic layer stack 610 and magnetic shield 620D is decreased to almost 0T. Also, the magnetic flux density in the left-most region of the graph is significantly smaller than the respective magnetic flux in FIG. 6C. Again, this is because magnetic shield 620D sinks magnetic flux density, thereby decreasing magnetic flux density in the surrounding region.

Figure 6E:
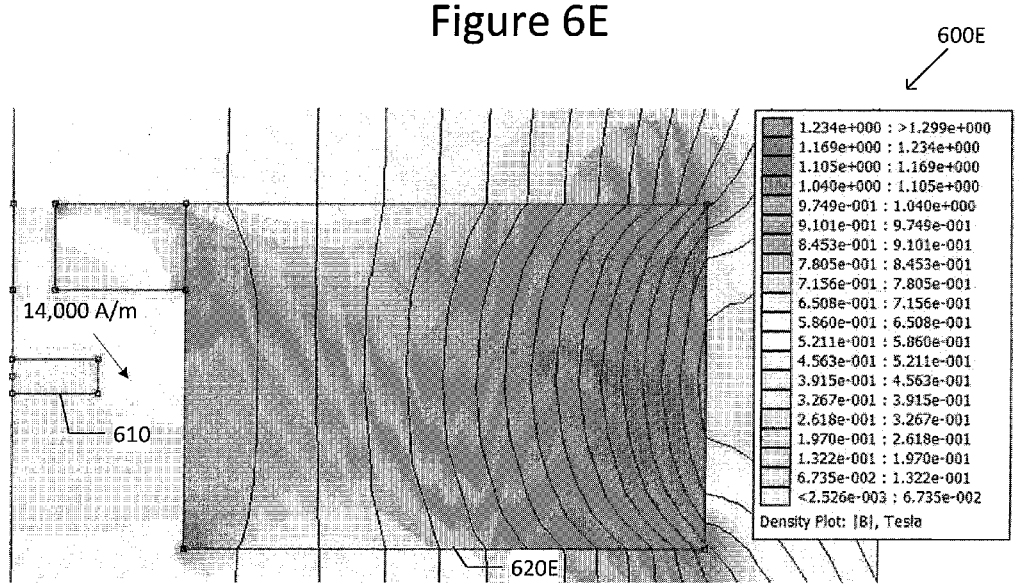
Figure 6E:
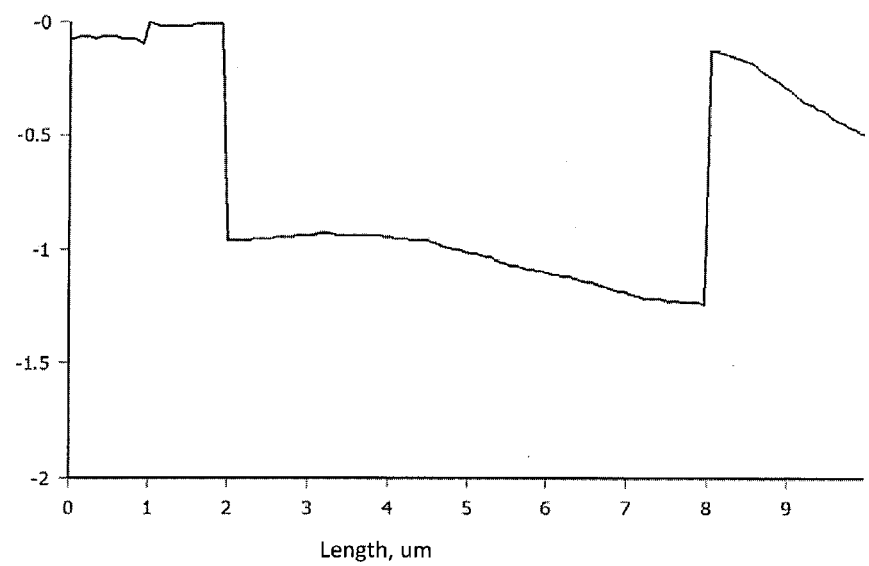

FIG. 6E illustrates magnetic flux density plot 600E of a perpendicular STT-MRAM magnetic layer stack 610 with magnetic shield 620E having a larger horizontal shield width similar to that of FIG. 6D, but additionally including a nose in the upper left-hand corner, in accordance with an exemplary embodiment. The homogenous magnetic field provided is the same as that in FIG. 6A.

As can be seen from density plot 600E in the upper portion of the figure, the magnetic flux density in the space between STT-MRAM magnetic layer stack 610 and magnetic shield 620E decreases to only 14,000 A/m. The graph in the lower portion of the figure shows the magnetic flux density in the magnetic shield 620E increased to −1.0 T, whereas the magnetic flux density in the space between STT-MRAM magnetic layer stack 610 and magnetic shield 620E is decreased to almost 0T. Also, the magnetic flux density in the left-most region of the graph is significantly smaller than the respective magnetic flux in FIG. 6D. This is due to the nose of magnetic shield 620E, which is further refracting the magnetic field lines and thus improving shielding.

FIGS. 7A-7F illustrate a method for manufacturing an array of perpendicular STT-MRAM cells in accordance with an exemplary embodiment. To be cost-effective, the magnetic shield should be integrated in the cell array during front-end-of-line (FEOL) processing.

Figure 7A:
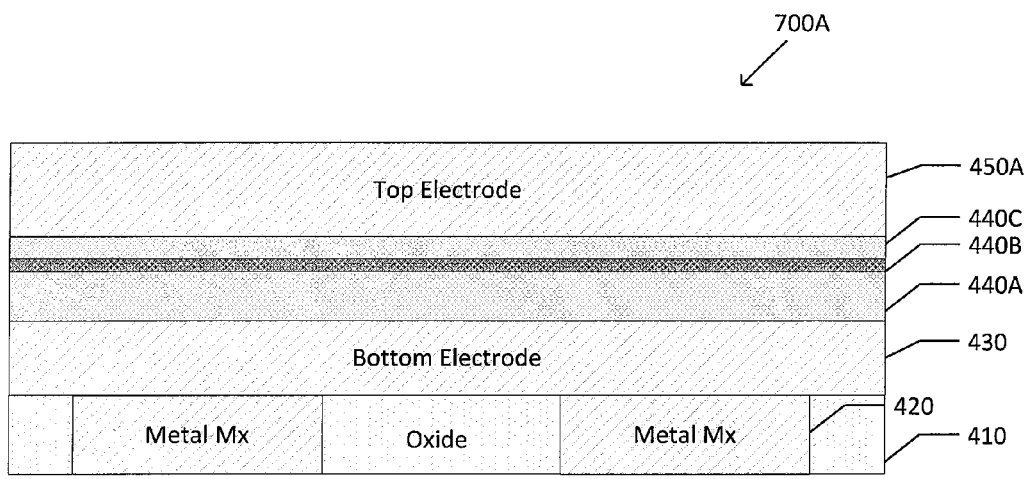
FIGS. 7A-7F illustrate a method for manufacturing an array of perpendicular STT-MRAM cells in accordance with an exemplary embodiment.

FIG. 7A illustrates STT-MRAM 700A, which includes metal Mx 420 formed in oxide 410. Bottom electrodes 430 are deposited on the layer of oxide 410 and metal Mx 420. Magnetic layer stack 440 comprised of magnetic layers 440A, 440C with tunnel oxide layer 440B therebetween is deposited on bottom electrode 430. Top electrode 450A is deposited on magnetic layer stack 440.

Figure 7B:
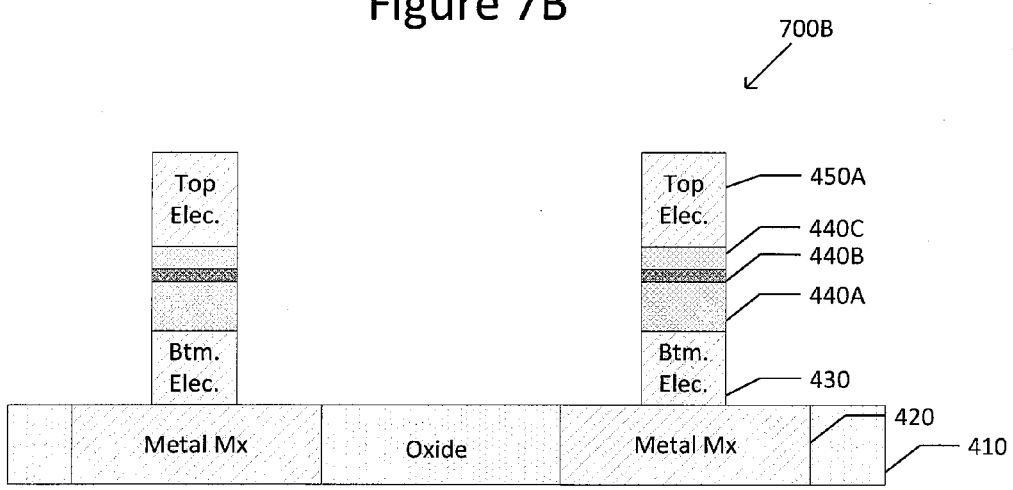

FIG. 7B illustrates STT-MRAM array 700B after STT-MRAM 700A is structured using a hard mask and etching to form individual MTJs comprised of bottom electrode 430, MRAM stacks having layers 440A, 440B, 440C, and top electrode 450A.

Figure 7C:
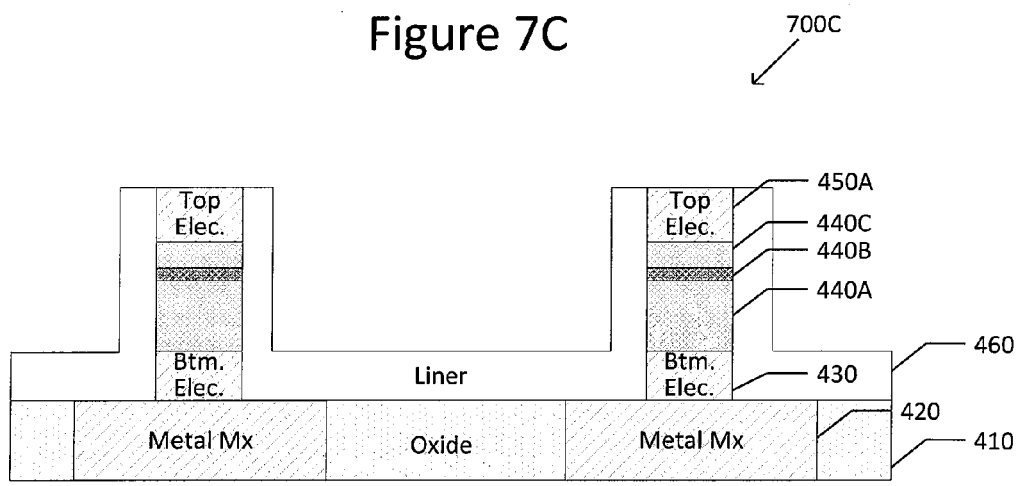

FIG. 7C illustrates STT-MRAM array 700C after a dielectric liner 460 is deposited on STT-MRAM array 700B for electrical isolation.

Figure 7D:
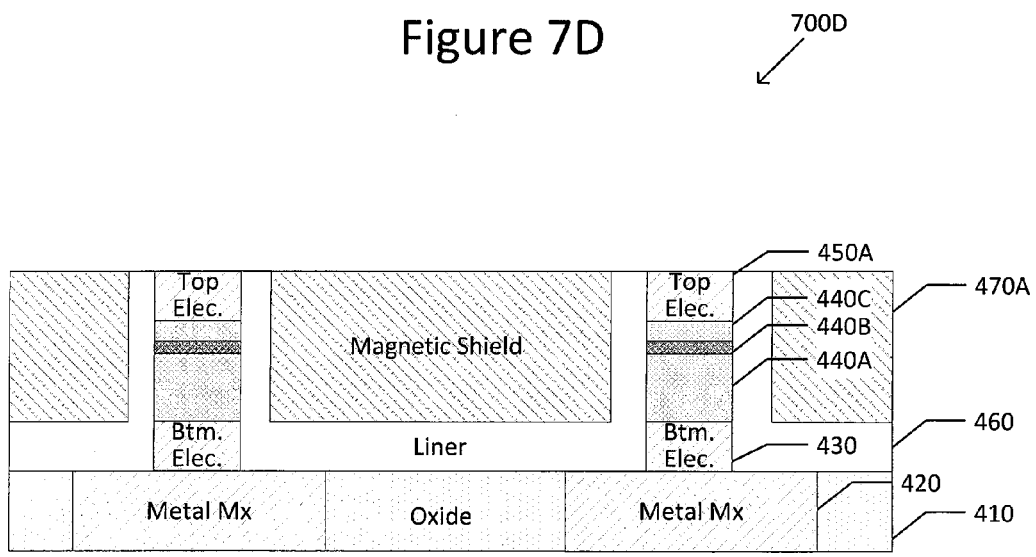

FIG. 7D illustrates STT-MRAM array 700D after the magnetic shield 470A is deposited thereon. The magnetic shield 470A is subjected to chemical mechanical planarization (CMP) with the dielectric liner 460 acting as a CMP-stop.

Figure 7E:
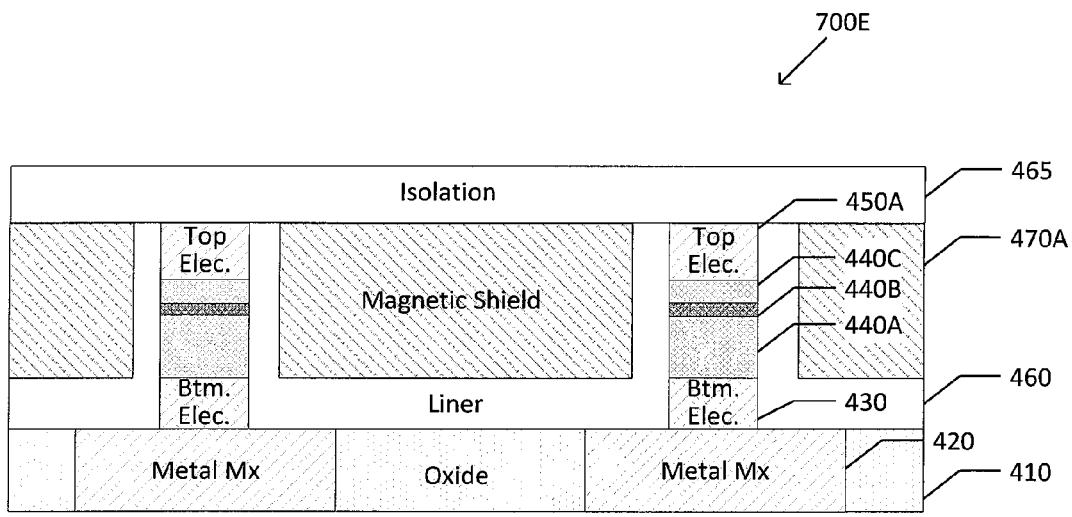

FIG. 7E illustrates STT-MRAM array 700E after isolation layer 465 is deposited on magnetic shield 470A.

Figure 7F:
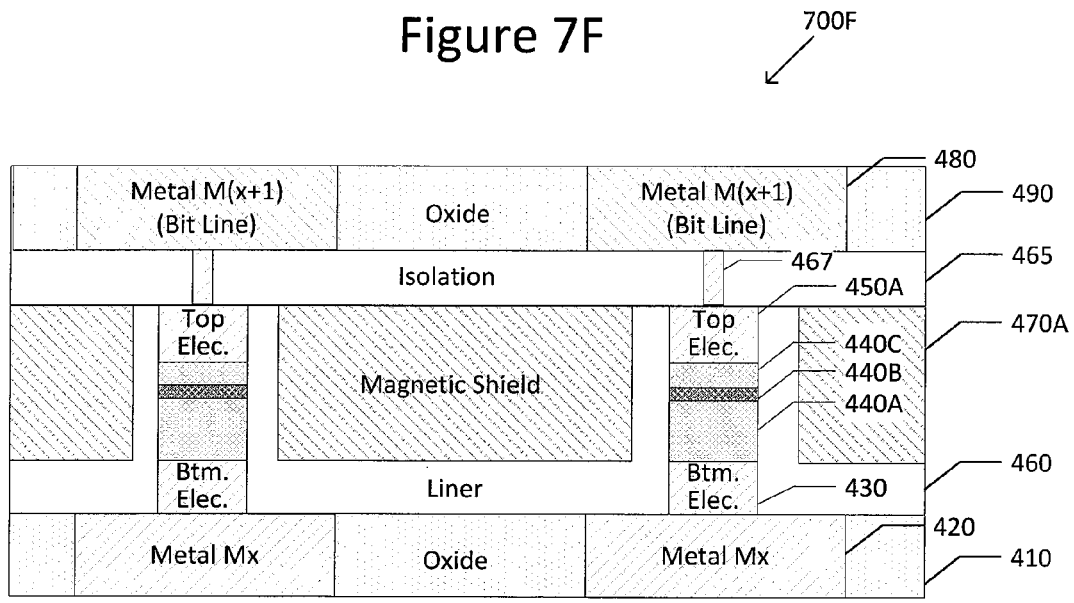

FIG. 7F illustrates STT-MRAM array 700F after metal M(x+1) layer 480 is formed in oxide 490 using a trench and via process on top of isolation layer 465. This trench and via process forms an electrical contact between metal M(x+1) 480 and top electrode 450A though via 467. It is noted that STT-MRAM array 700F is equivalent to STT-MRAM array 400A of FIG. 4A.

Those of skill should appreciate how individual layers of FIGS. 7A-7F are formed to result in STT-MRAM cells 400A of FIG. 4A, and also appreciated that there may be more than one way to form the layers. A more detailed description of the method for manufacturing an array of perpendicular STT-MRAM cells 400A is omitted for the sake of brevity and to not unnecessarily obscure aspects of the disclosure.

Further, those of skill would also appreciate from the above description how to manufacture an array of perpendicular STT-MRAM cells 400B of FIG. 4B. A further detailed description here is therefore not believed to be necessary.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present application. This application is intended to cover any adaptations or variations of the specific embodiments discussed herein.

What is claimed is:

1. A memory comprising:
    an array of perpendicular spin-transfer torque (STT) magnetic random access memory (MRAM) cells, wherein each cell has a magnetic layer stack;
    a magnetic shield disposed between the cells and having a minimum height of at least the height of the magnetic layer stacks to thereby shield the cells from memory-external magnetic fields; and
    an isolation layer disposed directly on the magnetic shield and a top electrode.

2. The memory of claim 1, wherein the height of the magnetic shield is higher than the height of the magnetic layer stacks.

3. The memory of claim 1, wherein the magnetic shield is shaped to have a horizontal projection formed at at least one of its top edges.

4. The memory of claim 1, wherein the height of the magnetic shield is a maximum height possible between bit and source lines located above and below the cells.

5. The memory of claim 1, wherein the magnetic shield is located in at least one of horizontal and vertical symmetrical arrangement with respect to a free magnetic layer within the magnetic layer stack.

6. The memory of claim 1, wherein the magnetic shield has a magnetic permeability of at least 10,000.

7. The memory of claim 1, wherein the magnetic shield has a magnetic permeability of between 50,000 and 140,000.

8. The memory of claim 1, wherein the magnetic shield is comprised of one or more layers of ferromagnets.

9. The memory of claim 8, wherein the ferromagnets comprise alloys selected from the group of alloys consisting of nickel (Ni), iron (Fe), and/or cobalt (Co).

10. The memory of claim 1, wherein the magnetic shield comprises at least one of ferrimagnets and ferrites.

11. The memory of claim 1, wherein the magnetic shield comprises one or more layers of different materials.

12. The memory of claim 1, wherein the magnetic shield substantially lacks magnetic coercivity.

13. The memory of claim 1, further comprising:
a dielectric liner is disposed between the cells and has a thickness large enough to provide electrical isolation.

14. The memory of claim 1, wherein a horizontal width of the magnetic shield disposed between the cells is large enough to fill space not occupied by bordering magnetic stacks and the dielectric line.

15. The memory of claim 1, wherein the magnetic shield is disposed alongside the entire height of the magnetic layer stacks.

16. The memory of claim 1, further comprising:
a dielectric liner disposed to surround at least a portion of the magnetic shield.

17. A memory comprising:
an array of perpendicular spin-transfer torque (STT) magnetic random access memory (MRAM) cells, wherein each cell has a magnetic layer stack; and
a magnetic shield disposed between the cells, shaped to have a horizontal projection formed at at least one of its top edges, and having a minimum height of at least the height of the magnetic layer stacks to thereby shield the cells from memory-external magnetic fields, wherein at least one of the cells has an electrode formed above the magnetic layer stack, and an upper portion of the electrode has a diameter that is less than the diameter of magnetic layer stack so as to accommodate the horizontal projection of the magnetic shield.

18. A memory comprising:
an array of spin-transfer torque (STT) magnetic random access memory (MRAM) cells, wherein each cell has a magnetic layer stack;
a magnetic shield disposed between the cells and having a minimum height of at least the height of the magnetic layer stacks to thereby shield the cells from memory-external magnetic fields; and
an isolation layer disposed directly on the magnetic shield and a top electrode.

19. The memory of claim 18, wherein the magnetic shield is disposed alongside to the entire height of the magnetic layer stacks.

20. The memory of claim 18, further comprising:
a dielectric liner disposed to surround at least a portion of the magnetic shield.

\* \* \* \* \*